(12) United States Patent
Farine et al.

(10) Patent No.: US 11,147,316 B2
(45) Date of Patent: Oct. 19, 2021

(54) AEROSOL GENERATING DEVICE WITH BATTERY INDICATION

(71) Applicant: PHILIP MORRIS PRODUCTS S.A., Neuchatel (CH)

(72) Inventors: Robin Farine, Auvernier (CH); Pascal Talon, Thonons-les-Bains (FR); Angelos Kolyris, St-Sulpice (CH)

(73) Assignee: PHILIP MORRIS PRODUCTS S.A., Neuchatel (CH)

( * ) Notice: Subject to any disclaimer, the term of this patent is extended or adjusted under 35 U.S.C. 154(b) by 530 days.

(21) Appl. No.: 15/303,424

(22) PCT Filed: Apr. 16, 2015

(86) PCT No.: PCT/EP2015/058321
§ 371 (c)(1),
(2) Date: Oct. 11, 2016

(87) PCT Pub. No.: WO2015/165747
PCT Pub. Date: Nov. 5, 2015

(65) Prior Publication Data
US 2017/0027234 A1    Feb. 2, 2017

(30) Foreign Application Priority Data
Apr. 30, 2014  (EP) .................................... 14166688

(51) Int. Cl.
*A01G 13/06* (2006.01)
*A24F 40/53* (2020.01)
(Continued)

(52) U.S. Cl.
CPC .............. *A24F 40/53* (2020.01); *A24F 40/60* (2020.01); *H01M 10/488* (2013.01);
(Continued)

(58) Field of Classification Search
CPC .............. A24F 47/008; H01M 10/488; H01M 2220/30; H05B 1/0244; H05B 2203/021
(Continued)

(56) References Cited

U.S. PATENT DOCUMENTS 5,388,594 A * 2/1995 Counts .................. A24F 47/008
128/202.21
2009/0095311 A1  4/2009 Han
(Continued)

FOREIGN PATENT DOCUMENTS

CA        3047478 A1   11/2011
CN      101624017 A    1/2010
(Continued)

OTHER PUBLICATIONS

English translation of CN101894982, Nov. 24, 2010 (Year: 2010).*
(Continued)

*Primary Examiner* — Sang Y Paik
(74) *Attorney, Agent, or Firm* — Oblon, McClelland, Maier & Neustadt, L.L.P.

(57) ABSTRACT

An aerosol generating device is provided, including a vaporiser configured to vaporise an aerosol-forming substrate; a battery connected to the vaporiser a control circuit configured to control a supply of power from the battery to the vaporiser; a memory storing a usage record of the device; and a replacement indicator configured to provide a signal to a user. The control circuit is configured to compare a measured voltage across the battery to a threshold voltage, and to generate an error signal to update the usage record if the measured voltage is less than the threshold voltage during an operation cycle. The control circuit is also configured to access the usage record and to activate the replacement indicator depending on the status of the usage record.

15 Claims, 3 Drawing Sheets

(51) Int. Cl.
*A24F 40/60* (2020.01)
*H01M 10/48* (2006.01)
*H05B 1/02* (2006.01)
*A24F 40/20* (2020.01)

(52) U.S. Cl.
CPC ............ *H05B 1/0244* (2013.01); *A24F 40/20* (2020.01); *H01M 2220/30* (2013.01); *H05B 2203/021* (2013.01)

(58) Field of Classification Search
USPC .................................................. 392/386–406
See application file for complete search history.

(56) References Cited

U.S. PATENT DOCUMENTS

| | | |
|---|---|---|
| 2009/0126745 A1 | 5/2009 | Hon |
| 2011/0209717 A1 | 9/2011 | Han |
| 2012/0227753 A1 | 9/2012 | Newton |
| 2013/0125906 A1 | 5/2013 | Hon |
| 2013/0139833 A1 | 6/2013 | Hon |
| 2013/0276798 A1 | 10/2013 | Hon |
| 2013/0319431 A1 | 12/2013 | Cyphert et al. |
| 2014/0096781 A1* | 4/2014 | Sears .................... A24F 47/008 131/328 |
| 2014/0209110 A1 | 7/2014 | Hon |

FOREIGN PATENT DOCUMENTS

| | | |
|---|---|---|
| CN | 101894982 A | 11/2010 |
| CN | 102132957 A | 7/2011 |
| CN | 103181622 A | 7/2013 |
| EP | 2 022 349 A1 | 2/2009 |
| EP | 2 609 820 A1 | 7/2013 |
| JP | 2002-228731 A | 8/2002 |
| JP | 2013-524835 A | 6/2013 |
| TW | 201332462 A1 | 8/2013 |
| WO | WO 2010/109784 A1 | 9/2010 |
| WO | 2013/020220 A1 | 2/2013 |
| WO | WO 2014/058678 A1 | 4/2014 |

OTHER PUBLICATIONS

International Search Report and Written Opinion of the International Searching Authority dated Jul. 15, 2015 in PCT/EP2015/058321 filed Apr. 16, 2015.
Combined Chinese Office Action and Search Report dated Nov. 28, 2018 in Chinese Patent Application No. 201580020647.3 (with English translation), 19 pages.
Office Action dated Sep. 5, 2018 in corresponding Taiwanese Patent Application No. 104112200 (with English Translation), 16 pages.
Japanese Decision of Grant dated Mar. 7, 2019 in Japanese Patent Application No. 2016-560644 (with English translation), 6 pages.
Canadian Office Action and Search Report dated May 21, 2021 in corresponding Canadian Patent Application No. 2935971, 6 pages.

* cited by examiner

AEROSOL GENERATING DEVICE WITH BATTERY INDICATION

The specification relates to an aerosol-generating device. In particular the invention relates to an aerosol-generating device including a vaporiser configured to vaporise an aerosol-forming substrate of a smoking article.

There is increasing demand for handheld aerosol-generating devices that are able to deliver aerosol for user inhalation. One particular area of demand is for heated smoking devices in which an aerosol-forming substrate is heated to release volatile flavour compounds, without combustion of the aerosol-forming substrate. The released volatile compounds are conveyed within an aerosol to the user.

Any aerosol-generating device that operates by heating an aerosol-forming substrate must include a heating element. One known type of aerosol-generating device for heating an aerosol-forming substrate of a smoking article operates by inserting an electrical heater into a solid aerosol-forming substrate and supplying power to the heater from a battery included in the device. However, batteries have a finite life and tend to suffer from a reduction in capacity over time which may cause a change in the properties of the aerosol conveyed to the user as the battery ages.

It would be desirable to provide an aerosol-generating device in which the change in the properties of the aerosol generated as the battery ages is mitigated.

In a first aspect of the invention, there is provided an aerosol generating device comprising:

a vaporiser configured to vaporise an aerosol-forming substrate;

a battery connected to the vaporiser;

a control circuit for controlling the supply of power from the battery to the vaporiser;

a memory for storing a usage record of the device; and a replacement indicator for signalling to a user, wherein the control circuit is configured to compare a measured voltage across the battery to a threshold voltage and to generate an error signal to update the usage record if the measured voltage is less than the threshold voltage during an operation cycle, and wherein the control circuit is configured to access the usage record and to activate the replacement indicator depending on the status of the usage record.

As used herein, an 'aerosol-generating device' relates to a device that interacts with an aerosol-forming substrate to generate an aerosol. The aerosol-forming substrate may be part of an aerosol-generating article, for example part of a smoking article. An aerosol-generating device may be a smoking device that interacts with an aerosol-forming substrate of an aerosol-generating article to generate an aerosol that is directly inhalable into a user's lungs thorough the user's mouth. An aerosol-generating device may be a holder.

As used herein, the term 'aerosol-forming substrate' relates to a substrate capable of releasing volatile compounds that can form an aerosol. Such volatile compounds may be released by heating the aerosol-forming substrate. An aerosol-forming substrate may conveniently be part of an aerosol-generating article or smoking article.

As used herein, the terms 'aerosol-generating article' and 'smoking article' refer to an article comprising an aerosol-forming substrate that is capable of releasing volatile compounds that can form an aerosol. For example, an aerosol-generating article may be a smoking article that generates an aerosol that is directly inhalable into a user's lungs through the user's mouth. An aerosol-generating article may be disposable. A smoking article comprising an aerosol-forming substrate comprising tobacco is referred to as a tobacco stick.

As used herein, the term 'operation cycle' relates to a period of continual operation of the device, extending from the time at which the device is switched on until the time at which the device is switched off. This could be a predetermined time interval, for example 6 minutes, or the time taken for the device to generate the required dose of aerosol or to draw a predetermined amount of energy from the battery. Where the aerosol-forming substrate is part of a smoking article, the operation cycle could relate to the time required for the smoking article to be used up, the operation cycle could relate to a set number of puffs of the device, or an predetermined time based on an average consumer's use.

As used herein, the term 'threshold voltage' is a predetermined voltage level defined based on battery specific factors including the battery's nominal voltage (average voltage at full charge under normal operating conditions) and the battery's voltage during operation which will be lower during the nominal voltage due to current draw from the battery during operation. In addition, the threshold voltage can be further defined based on the minimal voltage required, for example for the electronics that are present in the aerosol generating device. Electronic systems have a minimal voltage required for their operation and if the battery cannot supply that voltage, some or all of the electronic components present in the aerosol generating device will not function properly if at all. In order to prevent improper functioning, a check system, for example a circuit, is typically included to ensure that a voltage above the minimal required voltage required for correct operation of the electronic system. The threshold voltage, therefore, may be set between the minimal voltage required during operation and the nominal voltage. This allows recording of the voltage related fault when the systems voltage falls below the threshold voltage by the electronics system that is still operational above the minimal required voltage.

As a battery ages, its internal resistance will tend to increase, resulting in a decrease in battery capacity. Even if fully charged at the start of the operation of the device, the decreased capacity of the battery can result in a voltage drop during operation which is large enough to prevent the heater from heating the key volatile compounds to above their volatilization temperatures. This can significantly change the properties of the aerosol generated. The device may be configured to prevent power from being supplied by the battery to the heater if the voltage across the battery drops below a threshold value, referred to herein as the threshold voltage. This prevents an unsatisfactory user experience that requires volatilization of desired volatile compounds. However, when the supply of power to the heater is prevented, or where the properties of the aerosol adversely change, it may not be clear to the user whether the battery simply requires recharging, whether the battery has aged to such a degree that replacement is required, or if another fault is present. Additionally, batteries age at different rates depending on their initial condition, environment and use. Therefore, simply counting the number of operation cycles is not sufficient to accurately determine ageing of a battery.

By storing and updating a usage record and activating the replacement indicator depending on status of the usage record, the aerosol-generating device is capable of keeping track of the voltage drop over subsequent uses of the device and signalling to the user when replacement of the battery is required. This removes the burden from the user and helps the user to avoid replacing the battery unnecessarily.

The control circuit may be configured to continually compare the measured voltage to the threshold voltage. Alternatively, the control circuit may be configured to compare the measured voltage to the threshold voltage intermittently.

In certain embodiments, the control circuit may be arranged to generate a "no error" signal to update the usage record if the measured voltage remains above the threshold voltage during an entire operation of the device. This enables the control circuit to update the usage record according to the ratio between operations during which the voltage threshold was breached and operations during which the voltage remained above the threshold. The error and no error signals may be in the form of a binary code, for example "0" for no error and "1" for a low-voltage error.

The error signals may be in the form of a multiplier and the usage record may be a numerical value which is updated by multiplying the numerical value by the multiplier each time an error signal is generated. For example, the usage record may have an initial value of 20 and the error signal may comprise a multiplier with a value of 0.5. In such cases, the control circuit may be configured to activate the replacement indicator when the usage record reaches a set threshold, for example 1.25. The no error signals may also be in the form of a multiplier which differs from that of the error signals and the usage record may be updated by multiplying the numerical value by the multiplier each time a no error signal is generated.

Alternatively, the usage record may comprise a record of the total number of error signals. In such cases, the usage record may be updated by increasing the error signal count by one each time an error signal is generated. Where the control circuit is arranged to generate a "no error" signal to update the usage record if the measured voltage remains above the threshold voltage during an operation cycle of the device, the usage record may further comprise a record of the total number of no error signals. In such cases, the usage record may be updated by increasing the no error signal count by one each time a no error signal is generated.

The usage record may correspond to the entire usage history of the device. That is, the usage record may contain data relating to each and every operation of the device. Alternatively, the usage record may be limited to a predetermined number of operations of the device. This reduces the storage space required by the memory by allowing the least important operations from a battery-life perspective, that is the older operations, to be overwritten or otherwise deleted. For example, the usage record may be limited to less than the 30 most recent operations, to less than the 20 most recent operations, or to approximately the 16 most recent uses. By choosing to maintain a usage record of between 16 to 30 recent operations, a variety of data may be collected under a variety of external stimuli. For example, the user's usage record may reflect variation in the battery performance under different environments in which the user utilizes the aerosol generating device. As an example, the user may use the device at home at ambient temperature in the morning, at a bus stop in a colder environment during a morning commute, and then in an ambient temperature later in the morning at the office. By gathering a sufficient number of data points, a false positive may be avoided.

Where the usage record comprises a record of the total number of error signals, the control circuit may be configured to activate the replacement indicator if the total number of error signals stored in the usage record equals or exceeds a threshold error value. The threshold error value may be any suitable amount. For example, the threshold error value may be from 2 to 16, and is preferably approximately 16.

In one example, the device maintains a usage record of 16 operations. If a low voltage error signal has been generated during all 16 of the 16 operations stored in the usage record, the control circuit activates the indicator to signal to the user that replacement of the battery is required. Either alone or when additional factors, such as when the actual number of recharge cycles by the device exceeds a known recharge threshold, are recorded by the device, the number of low voltage error signals may be further reduced from the maximum number of operations stored in the usage record to 1 or more.

The control circuit may be configured to continue supplying power to the heater even if the voltage drops below the threshold voltage during use of the device. Alternatively, the control circuit is configured to reduce the supply of power to the heating element to zero if the measured voltage is less than the threshold voltage. Reducing the supply of power to zero is advantageous as it prevents an undesirable user experience by preventing operation when a consistent aerosol formation is not possible or would last for less time than with a normal operation cycle. In addition, not powering the heating element allows the system to conserve any remaining power to maintain device data and communications, as well as error indication, systems.

The device may include a data output means and the control circuit configured to provide the usage record to the data output means. This enables the usage record stored in the memory to be made available to the user via an external device, for example via a web application. The aerosol-generating device may include any suitable data output means for connection to an external device to allow the usage record to be exported to the external device and possibly further relayed to other external processing or data storage devices. For example, the aerosol-generating device may include a wireless radio or a universal serial bus (USB) socket connected to the control circuit. Alternatively, the aerosol-generating device may be configured to transfer usage data from the memory to an external memory in a battery charging device when the aerosol-generating device is recharged. The battery charging device can provide a larger memory for longer term storage of usage data and can be subsequently connected to a suitable data processing device or to a communications network.

The vaporiser may be any suitable device for vaporizing the aerosol-forming substrate. For example, the vaporiser may be a piezoelectric or ultrasonic device. Alternatively, the vaporiser comprises a heater including at least one heating element configured to heat the aerosol-forming substrate.

Where the vaporiser comprises a heater including at least one heating element configured to heat the aerosol-forming substrate, the device may include a heater mount coupled to the heater. In such embodiments, the heater mount provides structural support to the heater and allows it to be securely fixed within an aerosol-generating device. The heater mount may comprise a polymeric material and advantageously is formed from a moldable polymeric material, such as polyether ether ketone (PEEK). The use of a moldable polymer allows the heater mount to be moulded around the heater and thereby firmly hold the heater. It also allows the heater mount to be produced with a desired external shape and dimensions in an inexpensive manner. It is of course possible to use other materials for the heater mount, such as a ceramic material. Advantageously, the heater mount may be formed from a moldable ceramic material.

The heating element may be of any suitable type, for example the heater may comprise an induction heating element. Alternatively, the heater element may comprise an electrically resistive heating element. In such embodiments, the control circuit may be configured to control the supply of power to the heating element by determining the electrical resistance of the heating element and adjusting the electrical current supplied to the heating element dependent on the determined electrical resistance. The electrical resistance of the heating element is indicative of its temperature and so the determined electrical resistance may be compared with a target electrical resistance and the power provided adjusted accordingly. A PID control loop may be used to bring the determined temperature to a target temperature. Furthermore, mechanisms for temperature sensing other than detecting the electrical resistance of the heating element may be used, such as bimetallic strips, thermocouples or a dedicated thermistor or electrically resistive element that is electrically separate to the heating element. These alternative temperature sensing mechanisms may be used in addition to or instead of determining temperature by monitoring the electrical resistance of the heating element. For example, a separate temperature sensing mechanism may be used in the control circuit for cutting power to the heating element when the temperature of the heating element exceeds the allowable temperature range.

The heating element may comprise an electrically resistive material. Suitable electrically resistive materials include but are not limited to: semiconductors such as doped ceramics, electrically "conductive" ceramics (such as, for example, molybdenum disilicide), carbon, graphite, metals, metal alloys and composite materials made of a ceramic material and a metallic material. Such composite materials may comprise doped or undoped ceramics. Examples of suitable doped ceramics include doped silicon carbides. Examples of suitable metals include titanium, zirconium, tantalum platinum, gold and silver. Examples of suitable metal alloys include stainless steel, nickel-, cobalt-, chromium-, aluminium-titanium-zirconium-, hafnium-, niobium-, molybdenum-, tantalum-, tungsten-, tin-, gallium-, manganese-, gold- and iron-containing alloys, and super-alloys based on nickel, iron, cobalt, stainless steel, Timetal® and iron-manganese-aluminium based alloys. In composite materials, the electrically resistive material may optionally be embedded in, encapsulated or coated with an insulating material or vice-versa, depending on the kinetics of energy transfer and the external physicochemical properties required.

The heating element may comprise an internal heating element or an external heating element, or both internal and external heating elements, where "internal" and "external" refer to the aerosol-forming substrate. An internal heating element may take any suitable form. For example, an internal heating element may take the form of a heating blade. Alternatively, the internal heater may take the form of a casing or substrate having different electro-conductive portions, or an electrically resistive metallic tube. Alternatively, the internal heating element may be one or more heating needles or rods that are configured to run through the centre of the aerosol-forming substrate. Other alternatives include a heating wire or filament, for example a Ni—Cr (Nickel-Chromium), platinum, tungsten or alloy wire or a heating plate. Optionally, the internal heating element may be deposited in or on a rigid carrier material. In one such embodiment, the electrically resistive heating element may be formed using a metal having a defined relationship between temperature and resistivity. In such an exemplary device, the metal may be formed as a track on a suitable insulating material, such as ceramic material, and then sandwiched in another insulating material, such as a glass. Heaters formed in this manner may be used to both heat and monitor the temperature of the heating elements during operation.

An external heating element may take any suitable form. For example, an external heating element may take the form of one or more flexible heating foils on a dielectric substrate, such as polyimide. The flexible heating foils can be shaped to conform to the perimeter of the substrate receiving cavity. Alternatively, an external heating element may take the form of a metallic grid or grids, a flexible printed circuit board, a moulded interconnect device (MID), ceramic heater, flexible carbon fibre heater or may be formed using a coating technique, such as plasma vapour deposition, on a suitable shaped substrate. An external heating element may also be formed using a metal having a defined relationship between temperature and resistivity. In such an exemplary device, the metal may be formed as a track between two layers of suitable insulating materials. An external heating element formed in this manner may be used to both heat and monitor the temperature of the external heating element during operation.

The internal or external heating element may comprise a heat sink, or heat reservoir comprising a material capable of absorbing and storing heat and subsequently releasing the heat over time to the aerosol-forming substrate. The heat sink may be formed of any suitable material, such as a suitable metal or ceramic material. In one embodiment, the material has a high heat capacity (sensible heat storage material), or is a material capable of absorbing and subsequently releasing heat via a reversible process, such as a high temperature phase change. Suitable sensible heat storage materials include silica gel, alumina, carbon, glass mat, glass fibre, minerals, a metal or alloy such as aluminium, silver or lead, and a cellulose material such as paper. Other suitable materials which release heat via a reversible phase change include paraffin, sodium acetate, naphthalene, wax, polyethylene oxide, a metal, metal salt, a mixture of eutectic salts or an alloy. The heat sink or heat reservoir may be arranged such that it is directly in contact with the aerosol-forming substrate and can transfer the stored heat directly to the substrate. Alternatively, the heat stored in the heat sink or heat reservoir may be transferred to the aerosol-forming substrate by means of a heat conductor, such as a metallic tube.

The heating element advantageously heats the aerosol-forming substrate by means of conduction. The heating element may be configured such that it is at least partially in contact with the substrate, or the carrier on which the substrate is deposited. Alternatively, the heat from either an internal or external heating element may be conducted to the substrate by means of a heat conductive element.

The battery may be any suitable battery such as a rechargeable battery. In one embodiment, the battery is a Lithium-ion battery. Alternatively, the battery may be a Nickel-metal hydride battery, a Nickel cadmium battery, or a Lithium based battery, for example a Lithium-Cobalt, a Lithium-Iron-Phosphate, Lithium Titanate or a Lithium-Polymer battery.

The memory may be any suitable non-volatile memory. The memory may store the usage record as required without being supplemented by an external memory. Alternatively, the memory may provide a temporary store for the usage record before it is passed to a larger more permanent external memory.

The replacement indicator may be any suitable indicator, for example a display or a light source. Where the indicator is a display, the display may comprise a user interface to display system information, for example, battery power, temperature, status of aerosol-forming substrate, other messages, or combinations thereof. In one embodiment, the indicator is a light-emitting diode that may flash in a predetermined pattern consistent with an error code assigned to end of battery life. Alternatively or in addition, the replacement indicator may be a sound emitting device, for example a loudspeaker. Alternatively or in addition, the device may include a tactile device for vibrating the device. Alternatively or in addition, the indicator may include a wireless transmitter for connection to an external device or to a communications network, for example to alert the user that the power supply requires replacement via a portable communications device such as a mobile telephone, tablet or other handheld or wearable communications device. Alternatively or in addition, the indicator may be provided using a computer or portable communication device that is connected to the device using a hardwired connection, such as a USB or other connection. If such a connection is provided, additional indicators to diagnosis and notify the user of the type of error may be provided by software executed by the computer or portable communication device. The control circuit may be configured to activate the indicator by causing the indicator to immediately emit a signal to the user. Alternatively, or in addition, the control circuit may be configured to activate the indicator by causing the indicator to emit a signal to the user at any suitable time, such as when the device is connected or disconnected to a charging device, or, where the device includes a user operated button, when the button is pushed by the user.

The control circuit may be configured to activate the replacement indicator if the total number of error signals stored in the usage record does not exceed the threshold error value in a manner which differs from that when the total number of error signals stored in the usage record exceeds the threshold error value.

In one embodiment, the replacement indicator is a light source which emits one or more flashes of red light when activated by the control circuit. In such embodiments, the replacement indicator may be activated by the control circuit to emit a green light if the total number of error signals stored in the usage record does not exceed the threshold error value, for example when the device is connected or disconnected to a charging device, or, where the device includes a user operated button, when the button is pushed by the user.

The device is preferably a portable or handheld device that is comfortable to hold between the fingers of a single hand. The device may be substantially cylindrical in shape and has a length of between 70 and 120 mm. The maximum diameter of the device is preferably between 10 and 20 mm. In one embodiment the device has a polygonal cross section and has a protruding button formed on one face. In this embodiment, the diameter of the device is between 12.7 and 13.65 mm taken from a flat face to an opposing flat face; between 13.4 and 14.2 taken from an edge to an opposing edge (i.e., from the intersection of two faces on one side of the device to a corresponding intersection on the other side), and between 14.2 and 15 mm taken from a top of the button to an opposing bottom flat face.

The device may include other heaters in addition to the heater according to the first aspect. For example the device may include a cavity arranged to receive an aerosol-forming article and an external heater positioned around a perimeter of the cavity. An external heater may take any suitable form. For example, an external heater may take the form of one or more flexible heating foils on a dielectric substrate, such as polyimide. The flexible heating foils can be shaped to conform to the perimeter of the cavity. Alternatively, an external heater may take the form of a metallic grid or grids, a flexible printed circuit board, a moulded interconnect device (MID), ceramic heater, flexible carbon fibre heater or may be formed using a coating technique, such as plasma vapour deposition, on a suitable shaped substrate. An external heater may also be formed using a metal having a defined relationship between temperature and resistivity. In such an exemplary device, the metal may be formed as a track between two layers of suitable insulating materials. An external heater formed in this manner may be used to both heat and monitor the temperature of the external heater during operation.

In a second aspect of the invention, there is provided an aerosol-generating system comprising an aerosol-generating device according to the first aspect and one or more aerosol-forming articles containing an aerosol-forming substrate, the one or more aerosol-forming articles being configured to be received in a cavity of the aerosol-generating device.

The aerosol-forming article may be a smoking article. During operation a smoking article containing the aerosol-forming substrate may be partially contained within the aerosol-generating device.

The smoking article may be substantially cylindrical in shape. The smoking article may be substantially elongate. The smoking article may have a length and a circumference substantially perpendicular to the length. The aerosol-forming substrate may be substantially cylindrical in shape. The aerosol-forming substrate may be substantially elongate. The aerosol-forming substrate may also have a length and a circumference substantially perpendicular to the length.

The smoking article may have a total length between approximately 30 mm and approximately 100 mm. The smoking article may have an external diameter between approximately 5 mm and approximately 12 mm. The smoking article may comprise a filter plug. The filter plug may be located at a downstream end of the smoking article. The filter plug may be a cellulose acetate filter plug. The filter plug is approximately 7 mm in length in one embodiment, but may have a length of between approximately 5 mm to approximately 10 mm.

In one embodiment, the smoking article has a total length of approximately 45 mm. The smoking article may have an external diameter of approximately 7.2 mm. Further, the aerosol-forming substrate may have a length of approximately 10 mm. Alternatively, the aerosol-forming substrate may have a length of approximately 12 mm. Further, the diameter of the aerosol-forming substrate may be between approximately 5 mm and approximately 12 mm. The smoking article may comprise an outer paper wrapper. Further, the smoking article may comprise a separation between the aerosol-forming substrate and the filter plug. The separation may be approximately 18 mm, but may be in the range of approximately 5 mm to approximately 25 mm.

The aerosol-forming substrate may be a solid aerosol-forming substrate. Alternatively, the aerosol-forming substrate may comprise both solid and liquid components. The aerosol-forming substrate may comprise a tobacco-containing material containing volatile tobacco flavour compounds which are released from the substrate upon heating. Alternatively, the aerosol-forming substrate may comprise a non-tobacco material. The aerosol-forming substrate may further comprise an aerosol former that facilitates the formation of a dense and stable aerosol. Examples of suitable aerosol formers are glycerine and propylene glycol.

If the aerosol-forming substrate is a solid aerosol-forming substrate, the solid aerosol-forming substrate may comprise, for example, one or more of: powder, granules, pellets, shreds, spaghettis, strips or sheets containing one or more of: herb leaf, tobacco leaf, fragments of tobacco ribs, reconstituted tobacco, homogenised tobacco, extruded tobacco, cast leaf tobacco and expanded tobacco. The solid aerosol-forming substrate may be in loose form, or may be provided in a suitable container or cartridge. Optionally, the solid aerosol-forming substrate may contain additional tobacco or non-tobacco volatile flavour compounds, to be released upon heating of the substrate. The solid aerosol-forming substrate may also contain capsules that, for example, include the additional tobacco or non-tobacco volatile flavour compounds and such capsules may melt during heating of the solid aerosol-forming substrate.

As used herein, homogenised tobacco refers to material formed by agglomerating particulate tobacco. Homogenised tobacco may be in the form of a sheet. Homogenised tobacco material may have an aerosol-former content of greater than 5% on a dry weight basis. Homogenised tobacco material may alternatively have an aerosol former content of between 5% and 30% by weight on a dry weight basis. Sheets of homogenised tobacco material may be formed by agglomerating particulate tobacco obtained by grinding or otherwise combining one or both of tobacco leaf lamina and tobacco leaf stems. Alternatively, or in addition, sheets of homogenised tobacco material may comprise one or more of tobacco dust, tobacco fines and other particulate tobacco by-products formed during, for example, the treating, handling and shipping of tobacco. Sheets of homogenised tobacco material may comprise one or more intrinsic binders, that is tobacco endogenous binders, one or more extrinsic binders, that is tobacco exogenous binders, or a combination thereof to help agglomerate the particulate tobacco; alternatively, or in addition, sheets of homogenised tobacco material may comprise other additives including, but not limited to, tobacco and non-tobacco fibres, aerosol-formers, humectants, plasticizers, flavourants, fillers, aqueous and non-aqueous solvents and combinations thereof.

Optionally, the solid aerosol-forming substrate may be provided on or embedded in a thermally stable carrier. The carrier may take the form of powder, granules, pellets, shreds, spaghettis, strips or sheets. Alternatively, the carrier may be a tubular carrier having a thin layer of the solid substrate deposited on its inner surface, or on its outer surface, or on both its inner and outer surfaces. Such a tubular carrier may be formed of, for example, a paper, or paper like material, a non-woven carbon fibre mat, a low mass open mesh metallic screen, or a perforated metallic foil or any other thermally stable polymer matrix.

In a particularly preferred embodiment, the aerosol-forming substrate comprises a gathered crimped sheet of homogenised tobacco material. As used herein, the term ‘crimped sheet’ denotes a sheet having a plurality of substantially parallel ridges or corrugations. Preferably, when the aerosol-generating article has been assembled, the substantially parallel ridges or corrugations extend along or parallel to the longitudinal axis of the aerosol-generating article. This advantageously facilitates gathering of the crimped sheet of homogenised tobacco material to form the aerosol-forming substrate. However, it will be appreciated that crimped sheets of homogenised tobacco material for inclusion in the aerosol-generating article may alternatively or in addition have a plurality of substantially parallel ridges or corrugations that are disposed at an acute or obtuse angle to the longitudinal axis of the aerosol-generating article when the aerosol-generating article has been assembled. In certain embodiments, the aerosol-forming substrate may comprise a gathered sheet of homogenised tobacco material that is substantially evenly textured over substantially its entire surface. For example, the aerosol-forming substrate may comprise a gathered crimped sheet of homogenised tobacco material comprising a plurality of substantially parallel ridges or corrugations that are substantially evenly spaced-apart across the width of the sheet.

The solid aerosol-forming substrate may be deposited on the surface of the carrier in the form of, for example, a sheet, foam, gel or slurry. The solid aerosol-forming substrate may be deposited on the entire surface of the carrier, or alternatively, may be deposited in a patter in order to provide a non-uniform flavour delivery during use.

The aerosol-forming substrate may be a liquid aerosol-forming substrate, which may for example be held in a capillary material and heated. In one embodiment, the capillary material may be enclosed either with or without a heating element in a cartridge.

The aerosol-generating system is a combination of an aerosol-generating device and one or more aerosol-generating articles for use with the device. However, aerosol-generating systems may include additional components, such as for example a charging unit for recharging an on-board electric power supply in an electrically operated or electric aerosol-generating device.

In a third aspect of the invention, there is provided a method of controlling an aerosol-generating device using a control circuit, the device comprising: a vaporiser configured to vaporise an aerosol-forming substrate; a battery connected to the vaporiser; a control circuit for controlling the supply of power from the battery to the vaporiser; a memory for storing a usage record of the device; and a replacement indicator for signalling to a user, the method comprising the steps of: comparing a measured voltage across the battery to a threshold voltage during operation of the device; generating an error signal if the measured voltage is less than the threshold voltage during operation; updating the usage record with the error signal; accessing the usage record; and activating the replacement indicator depending on the status of the usage record.

In a fourth aspect of the invention, there is provided electric circuitry for an aerosol-generating device, the device comprising: a vaporiser configured to vaporise an aerosol-forming substrate; a battery connected to the vaporiser; a control circuit for controlling the supply of power from the battery to the vaporiser; a memory for storing a usage record of the device; and a replacement indicator for signalling to a user, the electric circuitry being arranged to perform the method of the third aspect of the invention.

In a fifth aspect of the invention, there is provided a computer program which, when run on programmable electric circuitry for an aerosol-generating device comprising: a vaporiser configured to vaporise an aerosol-forming substrate; a battery connected to the vaporiser; a control circuit for controlling the supply of power from the battery to the vaporiser; a memory for storing a usage record of the device; and a replacement indicator for signalling to a user, causes the programmable electric circuitry to perform the method of the third aspect of the invention.

In a sixth aspect of the invention, there is provided a computer readable storage medium having stored thereon a computer program according to claim the fifth aspect of the invention.

Although the disclosure has been described by reference to different aspects, it should be clear that features described in relation to one aspect of the disclosure may be applied to the other aspects of the disclosure. Furthermore, although the disclosure has been by reference to smoking devices, it should be clear that medical inhaler type devices may use the features, apparatuses, and functionalities described herein.

Embodiments of the invention will now be described in detail, by way of example only, with reference to the accompanying drawings, in which.

Figure 1:
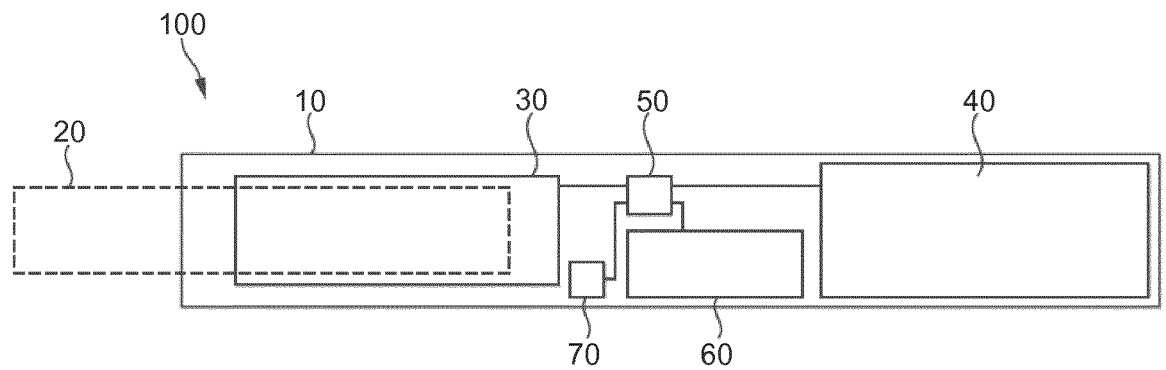
FIG. 1 is a schematic diagram of an aerosol generating device.

In FIG. 1, the components of an embodiment of an electrically heated aerosol-generating system 100 are shown in a simplified manner. Particularly, the elements of the electrically heated aerosol-generating system 100 are not drawn to scale in FIG. 1. Elements that are not relevant for the understanding of this embodiment have been omitted to simplify FIG. 1.

The electrically heated aerosol generating system 100 comprises an aerosol-generating device having a housing 10 and an aerosol-forming article 20, for example a tobacco stick. The aerosol-forming article 20 includes an aerosol-forming substrate that is pushed inside the housing 10 to come into thermal proximity with heater 30. The aerosol-forming substrate will release a range of volatile compounds at different temperatures. By controlling the maximum operation temperature of the electrically heated aerosol generating system 100, the selective release of undesirable compounds may be controlled by preventing the release of select volatile compounds.

Within the housing 10 there is an electrical energy supply 40, for example a rechargeable lithium ion battery. A control circuit 50 is connected to the heater 30, the electrical energy supply 40, a replacement indicator 60, for example a light, a display, or an audible alarm, and a memory 70. The control circuit 50 controls the power supplied to the heater 30 in order to regulate its temperature. Typically the aerosol-forming substrate is heated to a temperature of between 250 and 450 degrees centigrade.

Figure 2:
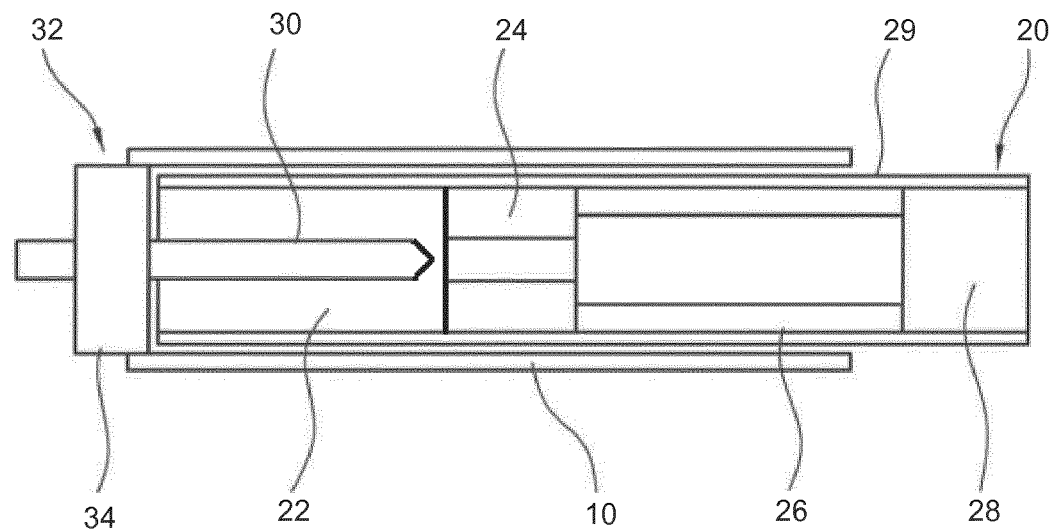
FIG. 2 is a schematic cross-section of a front end of an aerosol-generating device of the type shown in FIG. 1, with the heater inserted into a smoking article.

FIG. 2 is a schematic cross-section of a front end of an aerosol-generating device of the type shown in FIG. 1, with the heater 30 inserted into the aerosol-forming article 20, which in this embodiment is a smoking article. The aerosol-generating device is illustrated in engagement with the aerosol-forming article 20 for consumption of the aerosol-forming article 20 by a user.

The housing 10 of aerosol-generating device defines a cavity, open at the proximal end (or mouth end), for receiving an aerosol-generating article 20 for consumption. The distal end of the cavity is spanned by a heating assembly 32 comprising a heater 30 and a heater mount 34. The heater 30 is retained by the heater mount 34 such that an active heating area of the heater is located within the cavity. The active heating area of the heater 30 is positioned within a distal end of the aerosol-generating article 20 when the aerosol-generating article 20 is fully received within the cavity.

The heater 30 is shaped in the form of a blade terminating in a point. That is, the heater has a length dimension that is greater than its width dimension, which is greater than its thickness dimension. First and second faces of the heater are defined by the width and length of the heater.

An exemplary aerosol-forming article, as illustrated in FIG. 2, can be described as follows. The aerosol-generating article 20 comprises four elements: an aerosol-forming substrate 22, a support element, such as a hollow tube 24, a transfer section 26, and a mouthpiece filter 28. These four elements are arranged sequentially and in coaxial alignment and are assembled by a cigarette paper 29 to form a rod. When assembled, the aerosol-forming article is 45 millimetres long and has a diameter of 7 millimetres.

The aerosol-forming substrate comprises a bundle of crimped cast-leaf tobacco wrapped in a filter paper (not shown) to form a plug. The cast-leaf tobacco includes one or more aerosol formers, such as glycerine.

The hollow tube 24 is located immediately adjacent the aerosol-forming substrate 22 and is formed from a tube of cellulose acetate. The tube 24 defines an aperture having a diameter of 3 millimetres. One function of the hollow tube 24 is to locate the aerosol-forming substrate 22 towards the distal end of the rod so that it can be contacted with the heater. The hollow tube 24 acts to prevent the aerosol-generating substrate 22 from being forced along the rod towards the mouthpiece when a heater is inserted into the aerosol-forming substrate 22.

The transfer section 26 comprises a thin-walled tube of 18 millimetres in length. The transfer section 26 allows volatile substances released from the aerosol-forming substrate 22 to pass along the article towards the mouthpiece filter 28. The volatile substances may cool within the transfer section to form an aerosol.

The mouthpiece filter 28 is a conventional mouthpiece filter formed from cellulose acetate, and having a length of approximately 7.5 millimetres.

The four elements identified above are assembled by being tightly wrapped within a cigarette paper 29. The paper in this specific embodiment is a standard cigarette paper having standard properties or classification. The paper in this specific embodiment is a conventional cigarette paper. The interface between the paper and each of the elements locates the elements and defines the aerosol-forming article 20.

As the aerosol-generating article 20 is pushed into the cavity, the tapered point of the heater 30 engages with the aerosol-forming substrate 22. By applying a force to the aerosol-forming article, the heater penetrates into the aerosol-forming substrate 22. When the aerosol-forming article 20 is properly engaged with the aerosol-generating device, the heater 30 is inserted into the aerosol-forming substrate 22. When the heater is actuated, the aerosol-forming substrate 22 is warmed and volatile substances are generated or evolved. As a user draws on the mouthpiece filter 28, air is drawn into the aerosol-forming article and the volatile substances condense to form an inhalable aerosol. This aerosol passes through the mouthpiece filter 28 of the aerosol-forming article and into the user's mouth.

Figure 3:
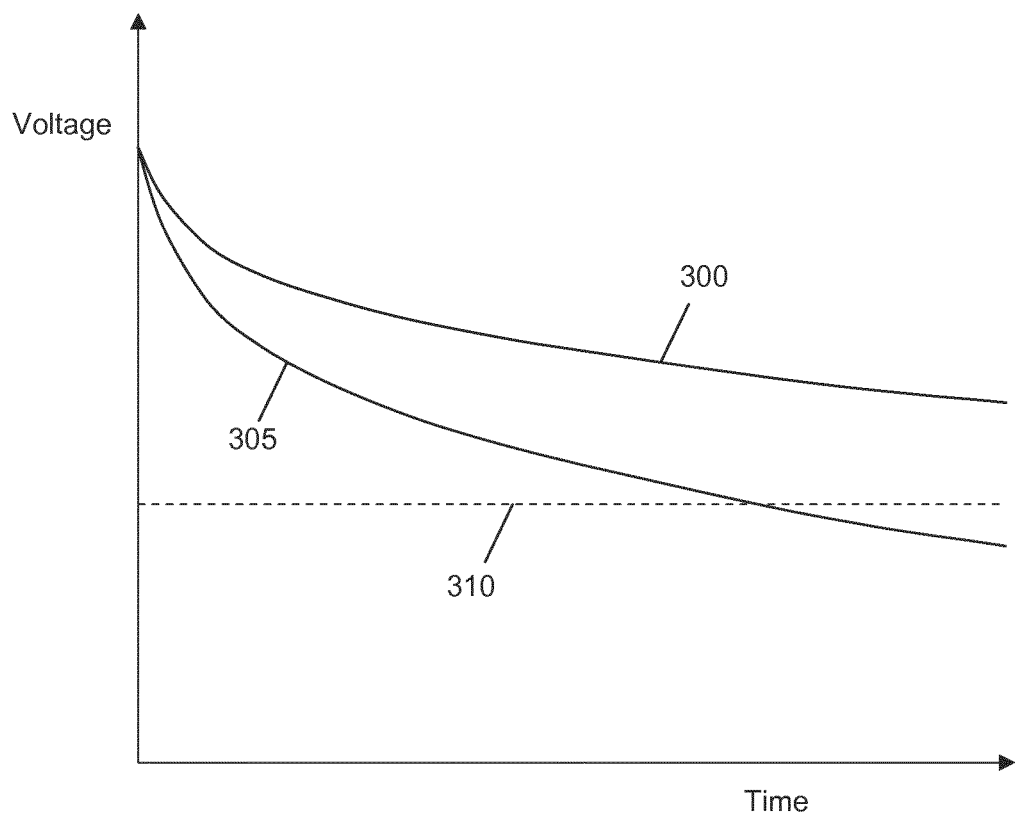
FIG. 3 is a graph illustrating an example of the voltage across the terminals of the battery of an aerosol generating device as a function of time.

FIG. 3 shows the voltage across the terminals of the electrical energy supply 40 as a function of time during use of the aerosol-generating device 100. Curve 300 is the voltage when the electrical energy supply 40 is new. Curve 305 is the voltage when the electrical energy supply 40 is approaching the end of its useful life. Both curves 300 and 305 illustrate a marked initial voltage drop which leads into a slight, steady voltage decrease. As seen in curve 305, the voltage drop is greater when the electrical energy supply 40 has aged. This is due to an increased internal resistance within the electrical energy supply 40.

Figure 4:
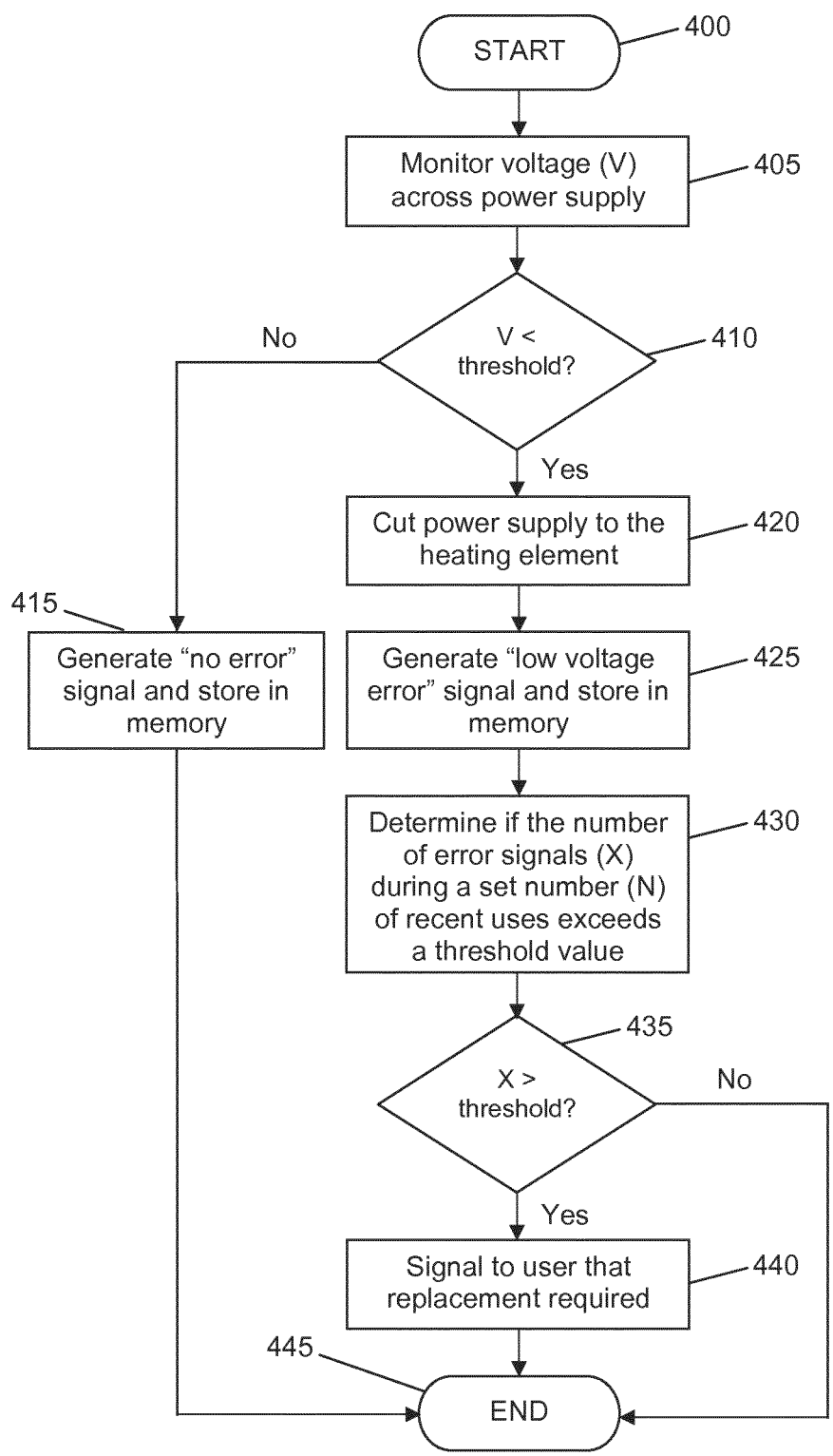
FIG. 4 illustrates a control sequence for determining if the battery requires replacement.

FIG. 4 illustrates an example of a control process that can be carried out by the control circuit to diagnose whether the electrical energy supply requires replacement and to inform the user if replacement is required. The process starts at step 400 each time the aerosol-generating device 100 is used. In step 405, the control circuit 50 measures the voltage ("V") across the terminals of the electrical energy supply 40 during the use of aerosol-generating device 100 and compares this to a threshold value of voltage to monitor whether V falls below the threshold voltage at any point. The threshold value of voltage is illustrated by dashed line 310 in FIG. 3. If V does not fall below the threshold voltage at any point during an operation, or "run", of the device 100, the process passes to step 415 as indicated by decision step 410. At step 415, the control circuit 50 generates a "no error" signal which it stores in the memory 70. If V falls below the threshold voltage at any point during a particular run, the process instead passes to step 420, where the control circuit 50 reduces the supply of power from the electrical energy supply 40 to the heater 30 to zero. The process then passes to step 425, where the control circuit 50 generates a "low voltage error" signal to indicate that the run was aborted due to low voltage in the electrical energy supply 40 and stores the signal in the memory 70. The "no error" and "low voltage error" signals stored in the memory 70 during steps 415 and 425 of the process for each use of the device combine to generate a usage record of the device 100. The usage record indicates how many runs of the device 100 were aborted due to low voltage and how many were carried out without experiencing any error. As the electrical energy supply 40 ages, the number of aborted runs is likely to increase and this will be demonstrated by the amount of "low voltage error" signals during the most recent runs of the device. At step 430, the control circuit 50 refers to the usage record in the memory 70 to determine if over the course of a set number of runs ("N") of the device the amount of "low voltage error" signals ("X") exceeds a threshold number of error signals. At step 435, the process branches depending on whether X exceeds the threshold number of error signals. If X exceeds the threshold number of error signals, the process passes to step 440 at which the control circuit 50 activates the replacement indicator 60 to signal to the user that the power supply 40 requires replacement. The process then ends at step 445. If the number of "low voltage error" signals, X, does not exceed the threshold, the control circuit 50 determines that the useful life of the electrical energy supply 40 has not yet expired and the process ends at step 445 without activating the replacement indicator 60.

As well as allowing the control circuit 50 to diagnose whether the electrical energy supply 40 requires replacement and to signal this to the user, the usage record stored in the memory 70 may also be useful to the user if it is made available to an external device, for example to allow the user to view the usage record via a web application. The aerosol-generating device 100 may include any suitable data output means for connection to an external device to allow the usage record to be exported to the external device and possibly further relayed to other external processing or data storage devices. For example, the aerosol-generating device 100 may include a wireless radio or a universal serial bus (USB) socket connected to the control circuit 50. Alternatively, the aerosol-generating device 100 may be configured to transfer usage data from the memory 70 to an external memory in a battery charging device when the aerosol-generating device is recharged. The battery charging device can provide a larger memory for longer term storage of usage data and can be subsequently connected to a suitable data processing device or to a communications network.

The exemplary embodiments described above illustrate but are not limiting. In view of the above discussed exemplary embodiments, other embodiments consistent with the above exemplary embodiments will now be apparent to one of ordinary skill in the art.

The invention claimed is:

1. An aerosol generating device, comprising:
    a vaporiser configured to vaporise an aerosol-forming substrate;
    a battery connected to the vaporiser;
    a control circuit configured to control a supply of power from the battery to the vaporiser;
    a memory storing a usage record of the device; and
    a replacement indicator configured to provide a signal to a user,
    wherein the control circuit is further configured to:
        compare a measured voltage across the battery to a threshold voltage and to generate an error signal if the measured voltage is less than the threshold voltage during an operation cycle,
        generate a no-error signal to update the usage record if the measured voltage remains above the threshold voltage during an entire operation cycle of the device,
        store a plurality of error signals and no-error signals generated over multiple operation cycles of the device in the stored usage record of the device, such that the stored usage record comprises a combination of the error signals and the no-error signals, and
        access the stored usage record and activate the replacement indicator if a total number of error signals stored in the usage record equals or exceeds a threshold error value, which is greater than 1.

2. The aerosol generating device according to claim 1, wherein the vaporiser comprises a heater including at least one heating element configured to heat the aerosol-forming substrate.

3. The aerosol-generating device according to claim 2, wherein the usage record is limited to less than the 30 most recent operation cycles.

4. The aerosol-generating device according to claim 2, wherein the usage record is limited to approximately the 16 most recent operation cycles.

5. The aerosol-generating device according to claim 1, wherein the usage record is limited to a predetermined number of operation cycles of the device.

6. The aerosol-generating device according to claim 1, wherein the control circuit is further configured to reduce the supply of power to the heating element to zero if the measured voltage is less than the threshold voltage.

7. The aerosol-generating device according to claim 1,
    wherein the device includes a data output means, and
    wherein the control circuit is further configured to provide the usage record to the data output means.

8. The aerosol-generating device according to claim 1, wherein the threshold error value is from two to 16.

9. The aerosol-generating device according to claim 1, wherein the control circuit is further configured to access the stored usage record and activate the replacement indicator if a total number of error signals generated over a predetermined number of operation cycles of the device and stored in the usage record equals or exceeds the threshold error value, which is greater than 1.

10. The aerosol-generating device according to claim 1, wherein the threshold error value is from 4 to 16.

11. The aerosol-generating device according to claim 1, wherein the control circuit is further configured to activate the replacement indicator based on a ratio of error signals to no-error signals.

12. An aerosol-generating system, comprising an aerosol-generating device according to claim 1 and one or more aerosol-forming articles containing the aerosol-forming substrate, the one or more aerosol-forming articles being configured to be received in a cavity of the aerosol-generating device.

13. A method of controlling an aerosol-generating device, the device comprising:
- a vaporiser configured to vaporise an aerosol-forming substrate;
- a battery connected to the vaporiser;
- a control circuit configured to control a supply of power from the battery to the vaporiser;
- a memory storing a usage record of the device; and
- a replacement indicator configured to provide a signal to a user; and the method comprising:
- comparing, using the control circuit, a measured voltage across the battery to a threshold voltage during operation of the device;
- generating, using the control circuit, an error signal if the measured voltage is less than the threshold voltage during operation;
- generating, using the control circuit, a no-error signal to update the usage record if the measured voltage remains above the threshold voltage during an entire operation cycle of the device,
- storing, using the control circuit, a plurality of error signals and no-error signals generated over multiple operation cycles of the device, such that the stored usage record comprises a combination of the error signals and the no-error signals;
- accessing, using the control circuit, the stored usage record; and
- activating, using the control circuit, the replacement indicator if a total number of error signals stored in the usage record equals or exceeds a threshold error value, which is greater than 1.

14. Electric circuitry for an aerosol-generating device, the device comprising:
- a vaporiser configured to vaporise an aerosol-forming substrate;
- a battery connected to the vaporiser;
- a control circuit configured to control a supply of power from the battery to the vaporiser;
- a memory storing a usage record of the device; and
- a replacement indicator configured to provide a signal to a user; and the electric circuitry being configured to perform a method comprising:
- comparing a measured voltage across the battery to a threshold voltage during operation of the device;
- generating an error signal if the measured voltage is less than the threshold voltage during operation;
- generating a no-error signal to update the usage record if the measured voltage remains above the threshold voltage during an entire operation cycle of the device;
- storing a plurality of error signals and no-error signals generated over multiple operation cycles of the device in the stored usage record of the device, such that the stored usage record comprises a combination of the error signals and the no-error signals;
- accessing the stored usage record; and
- activating the replacement indicator if a total number of error signals stored in the usage record equals or exceeds a threshold error value, which is greater than 1.

15. A nontransitory computer-readable storage medium having a computer program stored thereon, which when run on programmable electric circuitry for an aerosol-generating device comprising a vaporiser configured to vaporise an aerosol-forming substrate, a battery connected to the vaporiser, a control circuit configured to control a supply of power from the battery to the vaporiser, a memory storing a usage record of the device, and a replacement indicator configured to provide a signal to a user, causes the programmable electric circuitry to perform a method comprising:
- comparing, using the control circuit, a measured voltage across the battery to a threshold voltage during operation of the device;
- generating, using the control circuit, an error signal if the measured voltage is less than the threshold voltage during operation;
- generating, using the control circuit, a no-error signal to update the usage record if the measured voltage remains above the threshold voltage during an entire operation cycle of the device,
- storing, using the control circuit, a plurality of error signals and no-error signals generated over multiple operation cycles of the device in the stored usage record of the device, such that the stored usage record comprises a combination of the error signals and the no-error signals;
- accessing, using the control circuit, the stored usage record; and
- activating, using the control circuit, the replacement indicator if a total number of error signals stored in the usage record equals or exceeds a threshold error value, which is greater than 1.

* * * * *